(12) United States Patent
Jinzai

(10) Patent No.: US 6,515,532 B2
(45) Date of Patent: Feb. 4, 2003

(54) LEVEL SHIFT CIRCUIT FOR SHIFTING VOLTAGE LEVELS

(75) Inventor: Takao Jinzai, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/955,195

(22) Filed: Sep. 19, 2001

(65) Prior Publication Data

US 2002/0039042 A1 Apr. 4, 2002

(30) Foreign Application Priority Data

Sep. 29, 2000 (JP) ........................................ 2000-298969

(51) Int. Cl.[7] ................................................ H03L 5/00
(52) U.S. Cl. ......................... 327/333; 327/108; 326/83
(58) Field of Search ........................ 327/108–112, 333, 327/434, 436, 437; 326/80–83

(56) References Cited

U.S. PATENT DOCUMENTS 5,825,205 A * 10/1998 Ohtsuka ....................... 326/81
6,043,699 A * 3/2000 Shimizu ...................... 327/333

* cited by examiner

Primary Examiner—Kenneth B. Wells
(74) Attorney, Agent, or Firm—Dickstein Shapiro Morin & Oshinsky LLP

(57) ABSTRACT

A level shift circuit includes an initial stage circuit section which converts an input signal into a signal having a voltage level of the first high voltage power supply as a high level and a voltage level of the first low voltage power supply as a low level, an intermediate stage circuit section which level-shifts the signal output from the initial stage circuit section into a signal having the voltage level of the first high voltage power supply as a high level and the voltage level of the second low voltage power supply as a low level, and a final stage circuit section which level shifts the signal output from the intermediate stage circuit section into a signal having the voltage level of the second high voltage power supply as a high level and the voltage level of the second low voltage power supply as a low level.

6 Claims, 3 Drawing Sheets

LEVEL SHIFT CIRCUIT FOR SHIFTING VOLTAGE LEVELS

BACKGROUND OF THE INVENTION

This application claims the benefit of a Japanese Patent Application No. 2000-298969 filed Sep. 29, 2000, in the Japanese Patent Office.

1. Field of the Invention

The present invention generally relates to level shift circuits for converting a power supply voltage system of an input end to another power supply voltage system, and more particularly to a level shift circuit which shifts both levels of a high voltage power supply and a low voltage power supply of the power supply voltage system.

2. Description of the Related Art

FIG. 1 is a circuit diagram showing an example of a conventional level shift circuit.

In FIG. 1, a level shift circuit 100 includes an initial stage circuit section 101 and a final stage circuit section 102. The initial stage circuit section 101 converts an input signal received via an input terminal IN into a signal having a high-level voltage of +5 V and having a low-level voltage of 0 V. The final stage circuit section 102 converts the output signal of the initial stage circuit section 101 into a signal having a high level which is shifted to a voltage of +10 V. The initial stage circuit section 101 is formed by inverter circuits 103 and 104 which are connected in series, and output signals of the inverter circuits 103 and 104 are supplied to the final stage circuit section 102. A power supply voltage of +5 V is applied to a positive side power supply input terminal of each of the inverter circuits 103 and 104, and a power supply voltage of 0 V is applied to a negative side power supply input terminal of each of the inverter circuits 103 and 104.

On the other hand, the final stage circuit section 102 is formed by inverter circuits 105 and 107, and P-channel MOS transistors (hereinafter simply referred to as PMOS transistors) 106 and 108. The inverter circuit 105 receives the output signal of the inverter circuit 104. In addition, a power supply voltage of +10 V is applied to a positive side power supply input terminal of the inverter circuit 105 via the PMOS transistor 106, and a power supply voltage of 0 V is applied to a negative side power supply input terminal of the inverter circuit 105. Similarly, the inverter circuit 107 receives the output signal of the inverter circuit 103. In addition, the power supply voltage of +10 V is applied to a positive side power supply input terminal of the inverter circuit 107 via the PMOS transistor 108, and the power supply voltage of 0 V is applied to a negative side power supply input terminal of the inverter circuit 107. An output signal of the inverter circuit 107 is applied to a gate of the PMOS transistor 106, and an output signal of the inverter circuit 105 is applied to a gate of the PMOS transistor 108.

The output signal of the inverter circuit 104 is subjected to a level shift by the inverter circuit 105 and the PMOS transistor 106, so that a high-level voltage is level-shifted to +10 V and output from an output terminal OUT1 Similarly, the output signal of the inverter circuit 103 is subjected to a level shift by the inverter circuit 107 and the PMOS transistor 108, so that a high-level voltage is level-shifted to +10 V and output from an output terminal OUT2.

However, according to this conventional level shift circuit, it is only possible to shift the level of the high-level voltage or the low-level voltage of the input signal. For this reason, in order to shift the level of both the high-level voltage and the low-level voltage of the input signal, it is necessary to provide another level shift circuit. In other words, in the case where the level shift circuit 100 is used to shift the level of the high-level voltage of the input signal, it is necessary to provide another level shift circuit to soft the level of the low-level voltage of the input signal. Therefore, there was a problem in that two level shift circuits were necessary in order to shift the level of both the high-level voltage and the low-level voltage of the input signal.

SUMMARY OF THE INVENTION

Accordingly, it is a general object of the present invention to provide a novel and useful level shift circuit in which the problem described above is eliminated.

Another and more specific object of the present invention is to provide a level shift circuit which can shift the level of both a high-level voltage and a low-level voltage of an input signal.

Still another object of the present invention is to provide a level shift circuit comprising an initial stage circuit section, including a first inverter circuit portion coupled to a first high voltage power supply and to a first low voltage power supply, converting an input signal into a signal having a voltage level of the first high voltage power supply as a high level and a voltage level of the first low voltage power supply as a low level; an intermediate stage circuit section, including a second inverter circuit portion coupled to the first high voltage power supply and to a second low voltage power supply which supplies a voltage level lower than the first low voltage power supply, level-shifting the signal output from the initial stage circuit section into a signal having the voltage level of the first high voltage power supply as a high level and the voltage level of the second low voltage power supply as a low level, in response to the signal output from the initial stage circuit section; and a final stage circuit section, including a third inverter circuit portion coupled to the second low voltage power supply and to a second high voltage power supply which supplies a voltage level higher than the first high voltage power supply, level-shifting the signal output from the intermediate stage circuit section into a signal having the voltage level of the second high voltage power supply as a high level and the voltage level of the second low voltage power supply as a low level, in response to the signal output from the intermediate stage circuit section. According to the level shift circuit of the present invention, it is possible to shift the level of both a high-level voltage and a low-level voltage of an input signal by use of a simple circuit structure.

The intermediate stage circuit section may include an output end, and the second inverter circuit portion may include a first transistor coupled between the first high voltage power supply and the output end and responsive to the signal output from the initial stage circuit section, and a second transistor coupled between the output end and the second low voltage power supply. In this case, the second transistor of the second inverter circuit portion may have a control signal input terminal, and the level shift circuit may further comprise a voltage generating circuit which generates a voltage which is applied to the control signal input terminal of the second transistor.

Further, the voltage generating circuit may apply the voltage generated thereby to the second transistor of the second inverter circuit portion when each transistor within the second inverter circuit portion is in a ratioed state.

In addition, the voltage generating circuit may apply the voltage generated thereby to the second transistor of the second inverter circuit portion, so that a ratio of a first resistance between the first high voltage power supply and the second low voltage power supply and a second resistance between the output end of the intermediate stage circuit section and the second low voltage power supply, becomes a predetermined value.

A further object of the present invention is to provide a level shift circuit comprising an initial stage circuit section, coupled to a first high voltage power supply and to a first low voltage power supply, converting an input signal into a signal having a voltage level of the first high voltage power supply as a high level and a voltage level of the first low voltage power supply as a low level; an intermediate stage circuit section, coupled to the first high voltage power supply and to a second low voltage power supply which supplies a voltage level lower than the first low voltage power supply, level-shifting the signal output from the initial stage circuit section into a signal having the voltage level of the first high voltage power supply as a high level and the voltage level of the second low voltage power supply as a low level, in response to the signal output from the initial stage circuit section; and a final stage circuit section, coupled to the second low voltage power supply and to a second high voltage power supply which supplies a voltage level higher than the first high voltage power supply, level-shifting the signal output from the intermediate stage circuit section into a signal having the voltage level of the second high voltage power supply as a high level and the voltage level of the second low voltage power supply as a low level, in response to the signal output from the intermediate stage circuit section. According to the level shift circuit of the present invention, it is possible to shift the level of both a high-level voltage and a low-level voltage of an input signal by use of a simple circuit structure.

Another object of the present invention is to provide a level shift circuit comprising an initial stage circuit section converting an input signal into a signal having a first high-level voltage and a first low-level voltage; an intermediate stage circuit section outputting a signal by level-shifting the first low-level voltage of the signal output from the initial stage circuit section to a second low-level voltage, in response to the signal output from the initial stage circuit section; and a final stage circuit section outputting a signal by level-shifting the first high-level voltage of the signal output from the intermediate stage circuit section to a second high-level voltage, in response to the signal output from the intermediate stage circuit section. According to the level shift circuit of the present invention, it is possible to shift the level of both a high-level voltage and a low-level voltage of an input signal by use of a simple circuit structure.

Still another object of the present invention is to provide a level shift circuit comprising an initial stage circuit section converting an input signal into a signal having a first high-level voltage and a first low-level voltage; an intermediate stage circuit section outputting a signal by level-shifting one of the first low-level and high-level voltages of the signal output from the initial stage circuit section to a corresponding one of second low-level and high-level voltages, in response to the signal output from the initial stage circuit section; and a final stage circuit section outputting a signal by level-shifting the other of the first low-level and high-level voltages of the signal output from the intermediate stage circuit section to the other of the second low-level and high-level voltages, in response to the signal output from the intermediate stage circuit section. According to the level shift circuit of the present invention, it is possible to shift the level of both a high-level voltage and a low-level voltage of an input signal by use of a simple circuit structure.

Other objects and further features of the present invention will be apparent from the following detailed description when read in conjunction with the accompanying drawings.

DESCRIPTION OF THE PREFERRED EMBODIMENTS

Figure 1:
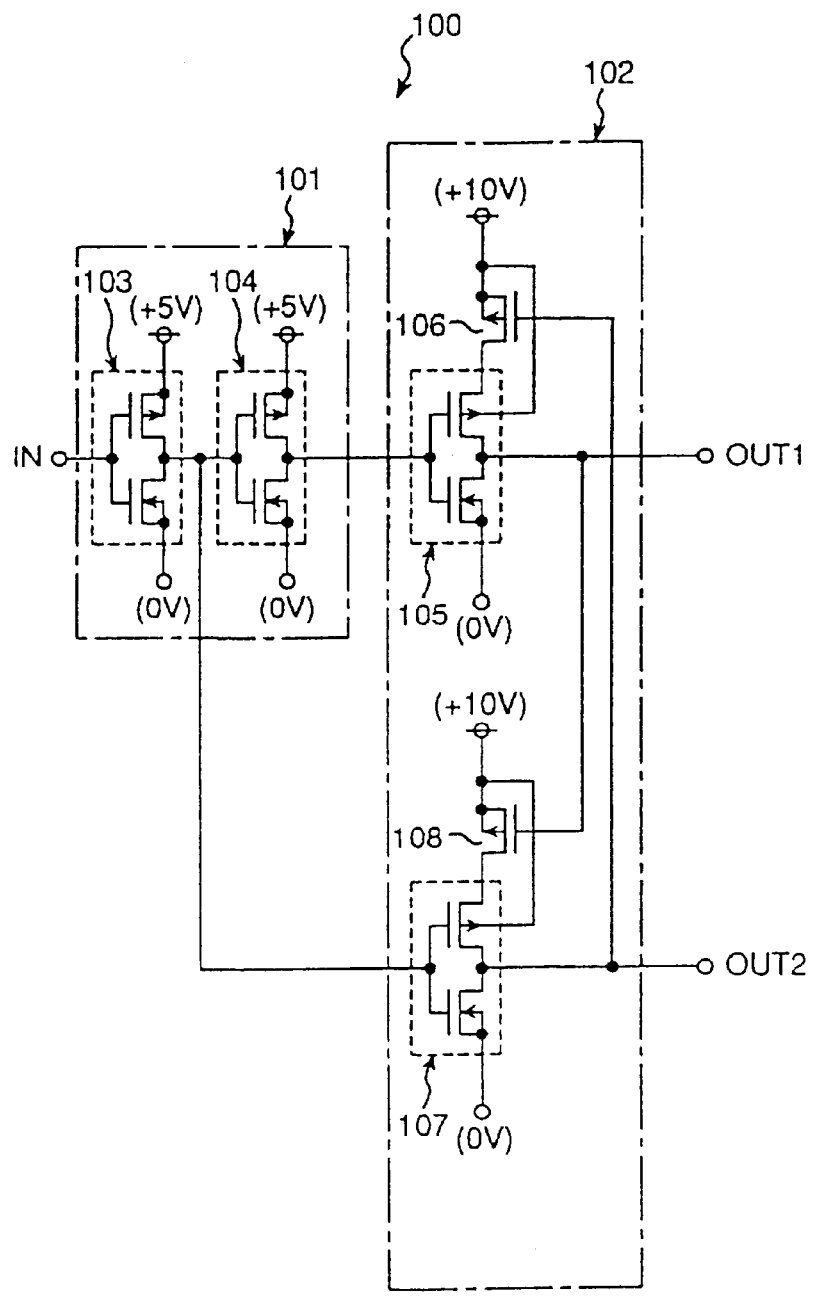
FIG. 1 is a circuit diagram showing an example of a conventional level shift circuit.
Figure 2:
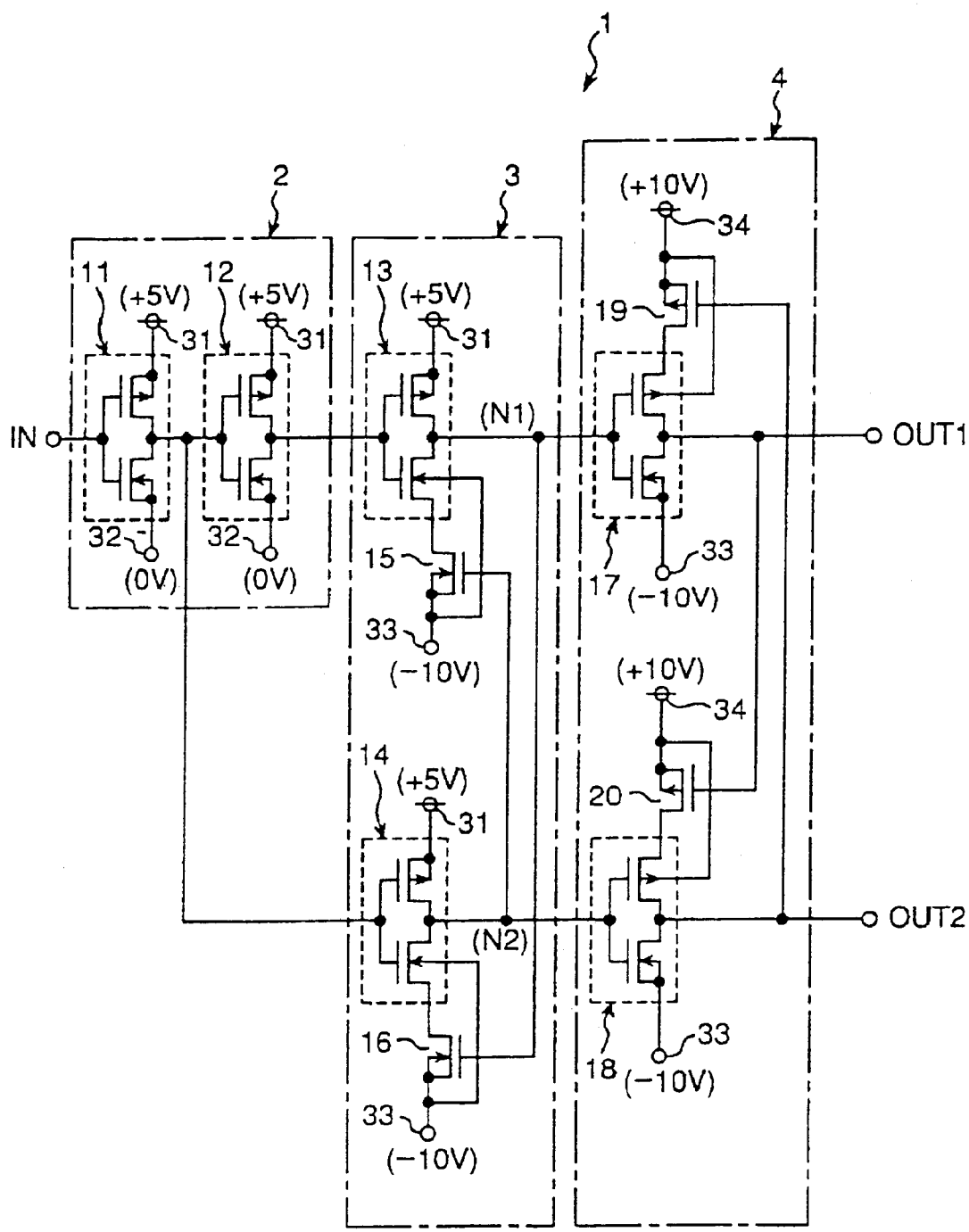
FIG. 2 is a circuit diagram showing a first embodiment of a level shift circuit according to the present invention.

FIG. 2 is a circuit diagram showing a first embodiment of a level shift circuit according to the present invention.

In FIG. 2, a level shift circuit 1 includes an initial stage circuit section 2, an intermediate stage circuit section 3, and a final stage circuit section 4. The initial stage circuit section 2 converts an input signal received via an input terminal IN into a signal having a high-level voltage of +5 V and having a low-level voltage of 0 V. The intermediate stage circuit section 3 converts the output signal of the initial stage circuit section 2 into a signal having a low level which is shifted to a voltage of −10 V. The final stage circuit section 4 converts the output signal of the intermediate stage circuit section 3 into a signal having a high level which is shifted to a voltage of +10 V.

The initial stage circuit section 2 is formed by inverter circuits 11 and 12 which are connected in series, and output signals of the inverter circuits 11 and 12 are supplied to the intermediate stage circuit section 3. A power supply voltage of +5 V is applied to a positive side power supply input terminal of each of the inverter circuits 11 and 12 via a first high voltage power supply terminal 31, and a power supply voltage of 0 V is applied to a negative side power supply input terminal of each of the inverter circuits 11 and 12 via a first low voltage power supply terminal 32.

In each of the inverter circuits 11 and 12, the power supply voltage of +5 V is applied to a substrate gate of each P-channel MOS transistor (hereinafter simply referred to as a PMOS transistor) via the first high voltage power supply terminal 31, and the power supply voltage of 0 V is applied to a substrate gate of each N-channel MOS transistor (hereinafter simply referred to as an NMOS transistor) via the first low voltage power supply terminal 32.

The intermediate stage circuit section 3 is formed by inverter circuits 13 and 14, and NMOS transistors 15 and 16. The inverter circuit 13 receives the output signal of the inverter circuit 12, In addition, the power supply voltage of +5 V is applied to a positive side power supply input terminal of the inverter circuit 13 from the first high voltage power supply terminal 31, and a power supply voltage of −10 V is applied to a negative side power supply input terminal of the inverter circuit 12 from a second low voltage power supply terminal 33 via the NMOS transistor 15. Similarly, the inverter circuit 14 receives the output signal of the inverter circuit 11. In addition, the power supply voltage of +5 V is applied to a positive side power supply input terminal of the inverter circuit 14 from the first high voltage power supply terminal 31, and the power supply voltage of −10 V is applied to a negative side power supply input terminal of the inverter circuit 14 from the second low voltage power supply terminal 33 via the NMOS transistor 16.

An output signal of the inverter circuit 14 is applied to a gate of the NMOS transistor 15, and an output signal of the inverter circuit 13 is applied to a gate of the NMOS transistor 16. In FIG. 2, a node N1 connects the output end of the inverter circuit 13 and the gate of the NMOS transistor 16, and a node N2 connects the output end of the inverter circuit 14 and the gate of the NMOS transistor 15.

In each of the inverter circuits 13 and 14, the power supply voltage of +5 V is applied to a substrate gate of each PMOS transistor from the first high voltage power supply terminal 31, and the power supply voltage of −10 V is applied to a substrate gate of each NMOS transistor from the second low voltage power supply terminal 33. Furthermore, the power supply voltage of −10 V is also applied to a substrate gate of each of the NMOS transistors 15 and 16 from the second low voltage power supply terminal 33.

The final stage circuit section 4 is formed by inverter circuits 17 and 18, and PMOS transistors 19 and 20. The inverter circuit 17 receives the output signal of the inverter circuit 13. In addition, a power supply voltage of +10 V is applied to a positive side power supply input terminal of the inverter circuit 17 from a second high voltage power supply terminal 34 via the PMOS transistor 19, and the power supply voltage of −10 V is applied to a negative side power supply input terminal of the inverter circuit 17 from the second low voltage power supply terminal 33. Similarly, the inverter circuit 18 receives the output signal of the inverter circuit 14. In addition, the power supply voltage of +10 V is applied to a positive side power supply input terminal of the inverter circuit 18 from the second high voltage power supply terminal 34 via the PMOS transistor 20, and the power supply voltage of −10 V is applied to a negative side power supply input terminal of the inverter circuit 18 from the second low voltage power supply terminal 33.

A node which connects the output end of the inverter circuit 17 and a gate of the PMOS transistor 20, is connected to an output terminal OUT1. Similarly, a gate which connects the output end of the inverter circuit 18 and a gate of the PMOS transistor 19, is connected to an output terminal OUT2. In each of the inverter circuits 17 and 18, the power supply voltage of +10 V is applied to a substrate gate of each PMOS transistor from the second high voltage power supply terminal 34, and the power supply voltage of −10 V is applied to a substrate gate of each NMOS transistor from the second low voltage power supply terminal 33. In addition, the power supply voltage of +10 V is applied to a substrate gate of each of the EMOS transistors 19 and 20 from the second high voltage power supply terminal 34.

In the initial stage circuit section 2, the input signal received via the input terminal IN is converted into a signal having a high-level voltage of +5 V and a low-level voltage of 0 V, and the signal level is inverted, and the signal level is then inverted again by the inverter circuit 12 before being output to the intermediate stage circuit section 3. The output signal of the initial stage circuit section 2, from the inverter circuit 12, is supplied to the inverter circuit 13 of the intermediate stage circuit section 3. Hence, the low-level voltage of the signal is level-shifted to −10 V by the inverter circuit 13 and the. NMOS transistor 15, and the signal level is inverted, before being output to the inverter circuit 17 of the final stage circuit section 4 via the inverter circuit 13.

Similarly, the output signal of the inverter circuit 11 of the initial stage circuit section 2 is supplied to the inverter circuit 14 of the intermediate stage circuit section 3, and the low-level voltage of the signal is level-shifted to −10 V by the inverter circuit 14 and the NMOS transistor 16, and the signal level is inverted, before being output to the inverter circuit 18 of the final stage circuit section 4 via the inverter circuit 14.

Next, the high-level voltage of the output signal of the inverter circuit 13 is level-shifted to +10 V by the inverter circuit 17 and the PMOS transistor 19, and the signal level is inverted, before being output to the output terminal OUT1. Similarly, the high-level voltage of the output signal of the inverter circuit 14 is level-shifted to +10 V by the inverter circuit 18 and the PMOS transistor 20, and the signal level is inverted, before being output to the output terminal OUT2. Hence, complementary signals respectively having the high-level voltage which is level-shifted to +10 V and the low-level voltage which is level-shifted to −10 V are output via the output terminals OUT1 and OUT2.

In this first embodiment, the high-level voltage of the input signal is level-shifted to +10 V and the low-level voltage of the input signal is level-shifted to −10 V. However, the voltages to which the high-level and low-level voltages of the input signal are level-shifted are of course not limited to such. This first embodiment can be appropriately be modified to level-shift the high-level and low-level voltages of the input signal to desired voltages.

Therefore, according to this first embodiment of the level shift circuit, the initial stage circuit section 2 converts the input signal into a signal having a high-level voltage of +5 V and a low-level voltage of 0 V, the intermediate stage circuit section 3 further level-shifts the low-level voltage to −10 V, and the final stage circuit section 4 further level-shifts the high-level voltage to +10 V. As a result, it is possible to level-shift both the high-level voltage and the low-level voltage of the input signal by a single level shift circuit 1 having a simple circuit structure shown in FIG. 2.

Next, a description will be given of a second embodiment of the level shift circuit according to the present invention.

In a transitional period of the level shitting the intermediate stage circuit section 3 of the first embodiment described above, each transistor within the inverter circuit 13 and the NMOS transistor 15 may assume a ratioed state, and if the output signal voltage of the inverter circuit 13 is less than or equal to a threshold voltage Vth of the NMOS transistor 15, the voltage at the output end of the inverter circuit 13 may not be inverted until the threshold voltage Vth of the NMOS transistor 14 is exceeded. A similar situation occurs with respect to the inverter circuit 14 and the NMOS transistor 16. For this reason, no problem will occur in the case of the level shifts to voltages on the order of −10 V and +10 V. But in the case of the level shifts to high voltages, such as −40 V and +40 V, for example, a response speed with respect to a change in the signal level will deteriorate unless the gate size of each of the PMOS transistors within the inverter circuits 13 and 14 are increased to appropriate gate sizes.

Accordingly, in order to prevent the deterioration of the response speed, a resistance between the second low voltage power supply terminal 33 and the node N1 with respect to a resistance between the first high voltage power supply terminal 31 and the node N1 may be changed to an optimum value, and a resistance between the second low voltage power supply terminal 33 and the node N2 with respect to a resistance between the first high voltage power supply terminal 31 and the node N2 may be changed to an optimum value, so that a ratio of the two resistances become a predetermined value, in the intermediate stage circuit section 3 which may be in the transitional period of the level shift, as done in this.second embodiment described hereunder.

Figure 3:
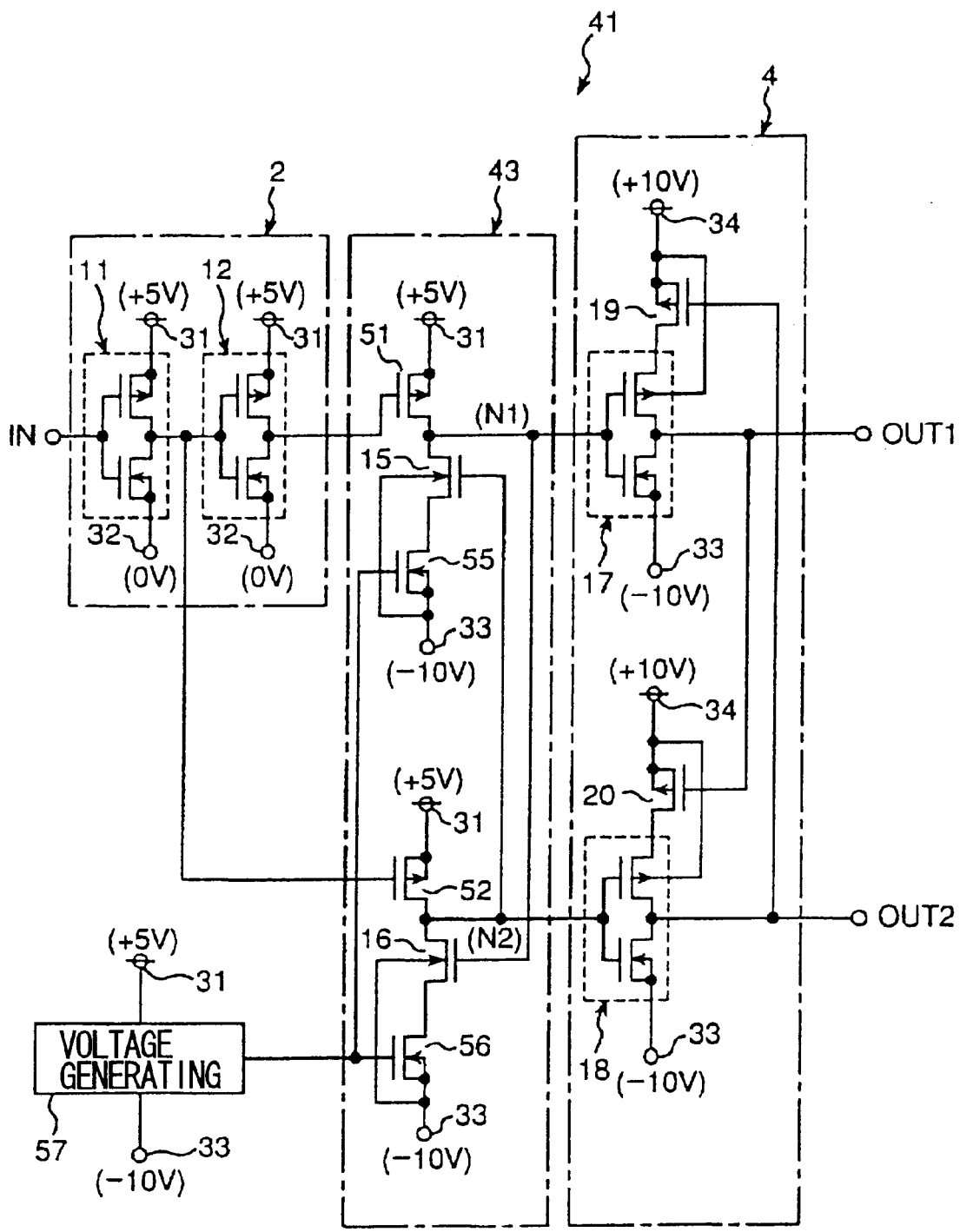
FIG. 3 is a circuit diagram showing a second embodiment of the level shift circuit according to the present invention.

FIG. 3 is a circuit diagram showing the second embodiment of the level shift circuit according to the present invention. In FIG. 3, those parts which are the same as those corresponding parts in FIG. 2 are designated by the same reference numerals, and a description thereof will be omitted.

In the level shift circuit 41 shown in FIG. 3, an intermediate stage circuit section 43 and a voltage generating circuit 57 are provided in place of the intermediate stage circuit section 3 shown in FIG. 2. In other words, the inverter circuit 13 of the first embodiment is replaced by a PMOS transistor 51, the inverter circuit 14 of the first embodiment is replaced by a PMOS transistor 52, and NMOS transistors 15 and 16 of the first embodiment are respectively replaced by NMOS transistors 55 and 56.

The intermediate stage circuit section 43 level-shifts only the low-level voltage of the output signal of the initial stage circuit section 2 to −10 V. The intermediate stage circuit section 43 includes first and second series circuits. The first series circuit is formed by the PMOS transistor 51 and the NMOS transistors 15 and 55 which are connected in series. The second series circuit is formed by the PMOS transistor 52 and the NMOS transistors 16 and 56 which are connected in series. Each of these first and second series circuits forms an inverter circuit. The node N1 connects the PMOS transistor 51 and the NMOS transistor 15, and the node N2 connects the PMOS transistor 52 and the NMOS transistor 16.

The output signal of the inverter circuit 12 is applied to a gate of the PMOS transistor 51, and the output signal of the inverter circuit 11 is applied to a gate of the PMOS transistor 52. Gates of the NMOS transistors 55 and 56 are connected, and a gate voltage is supplied from the voltage generating circuit 57 to each of these NMOS transistors 55 and 56. The power supply voltage of +5 V is applied to a substrate gate of each of the PMOS transistors 51 and 52 from the first high voltage power supply terminal 31, and the power supply voltage −10 V is applied to a substrate gate of each of the NMOS transistors 15, 16, 55 and 56 from the second low voltage power supply terminal 33.

The gate of each of the NMOS transistors 55 and 56 is applied with the voltage from the voltage generating circuit 57, such that an ON-resistance of each of the NMOS transistors 55 and 56 becomes approximately the same as an ON-resistance of the PMOS transistor 51 or 52. Hence, when the PMOS transistors 51 and 52 and the NMOS transistors 15, 16, 55 and 56 are in the ratioed state in the transitional period of the intermediate stage circuit section 43, the voltage at the node N1 becomes greater than or equal to the threshold voltage of the NMOS transistor 15, and the voltage at the node N2 becomes greater than or equal to the threshold voltage of the NMOS transistor 16. Therefore, the intermediate stage circuit section 43 can carry out a smooth inversion operation.

In this second embodiment, the high-level voltage of the input signal is level-shifted to +10 V and the low-level voltage of the input signal is level-shifted to −10 V, similarly to the first embodiment described above. However, the voltages to which the high-level and low-level voltages of the input signal are level-shifted are of course not limited to such. This second embodiment can be appropriately be modified to level-shift the high-level and low-level voltages of the input signal to desired voltages. Furthermore, compared to the first embodiment described above, this second embodiment can prevent deterioration of the response with respect to the change in the input signal level, even when the level-shift is made to a voltage higher than that of the first embodiment.

Accordingly, in this second embodiment of the level shift circuit, the voltage generating circuit 57 is provided to supply the voltage to the NMOS transistors 55 and 56 so that the resistance between the second low voltage power supply terminal 33 and the node N1 with respect to the resistance between the first high voltage power supply terminal 31 and the node N1 is changed to an optimum value, and the resistance between the second low voltage power supply terminal 33 and the node N2 with respect to the resistance between the first high voltage power supply terminal 31 and the node N2 is changed to an optimum value, in the intermediate stage circuit section 43 which is in the transitional period of the level shift. Consequently, even if the level-shift is made to high voltage, such as +40 V and −40 V, for example, this second embodiment can prevent the deterioration of the response speed with respect to the change in the signal level, in addition to obtaining the same effects as the first embodiment described above.

The voltage generating circuit 57 of the second embodiment may of course be a part of the level shift circuit 41, or be an external circuit to the level shift circuit 41.

In the first and second embodiment described above, the low-level voltage of the input signal is level-shifted first, and the high-level voltage of the input signal is level-shifted thereafter. However, it is of course possible to level-shift the high-level voltage of the input signal first, and thereafter level-shift the low-level voltage of the input signal.

Further, the present invention is not limited to these embodiments, but various variations and modifications may be made without departing from the scope of the present invention.

What is claimed is:

1. A level shift circuit comprising:

an initial stage circuit section, including a first inverter circuit portion coupled to a first high voltage power supply and to a first low voltage power supply, converting an input signal into a signal having a voltage level of the first high voltage power supply as a high level and a voltage level of the first low voltage power supply as a low level;

an intermediate stage circuit section, including a second inverter circuit portion coupled to the first high voltage power supply and to a second low voltage power supply which supplies a voltage level lower than the first low voltage power supply, level-shifting the signal output from said initial stage circuit section into a signal having the voltage level of the first high voltage power supply as a high level and the voltage level of the second low voltage power supply as a low level, in response to the signal output from said initial stage circuit section; wherein said intermediate state circuit section includes an output end; wherein said second inverter circuit portion includes a first transistor coupled between the first high voltage power supply and the output end and responsive to the signal output from said initial stage circuit section, and a second transistor coupled between the output end and the second low voltage power supply, wherein the second transistor of the second inverter circuit portion has a control signal input terminal for receiving a voltage from a voltage generating circuit; and a final stage circuit section, including a third inverter circuit portion coupled to the second low voltage power supply and to a second high voltage power supply which supplies a voltage level higher than the first high voltage power supply, level-shifting the signal output from said intermediate stage circuit section into a signal having the voltage level of the second high voltage power supply as a high level and the voltage level of the second low voltage power supply as a low level, in response to the signal output from said intermediate stage circuit section.

2. The level shift circuit as claimed in claim 1, wherein said voltage generating circuit applies the voltage generated thereby to the second transistor of the second inverter circuit portion when each transistor within the second inverter circuit portion is in a ratioed state.

3. The level shift circuit as claimed in claim 2, wherein said voltage generating circuit applies the voltage generated thereby to the second transistor of the second inverter circuit portion, so that a ratio of a first resistance between the first high voltage power supply and the second low voltage power supply and a second resistance between the output end of said intermediate stage circuit section and the second low voltage power supply becomes a predetermined value.

4. A level shift circuit comprising:

an initial stage circuit section, coupled to a first high voltage power supply and to a first low voltage power supply, converting an input signal into a signal having a voltage level of the first high voltage power supply as a high level and a voltage level of the first low voltage power supply as a low level;

an intermediate stage circuit section, coupled to the first high voltage power supply and to a second low voltage power supply which supplies a voltage level lower than the first low voltage power supply, level-shifting the signal output from said initial stage circuit section into a signal having the voltage level of the first high voltage power supply as a high level and the voltage level of the second low voltage power supply as a low level, in response to the signal output from said initial stage circuit section, said intermediate stage circuit section also including a circuit which controls a ratio of a first resistance between the first high voltage power supply and the second low voltage power supply and a second resistance between an output end of said intermediate stage circuit section and the second low voltage power supply to a predetermined value in response to a control voltage; and a final stage circuit section, coupled to the second low voltage power supply and to a second high voltage power supply which supplies a voltage level higher than the first high voltage power supply, level-shifting the signal output from said intermediate stage circuit section into a signal having the voltage level of the second high voltage power supply as a high level and the voltage level of the second low voltage power supply as a low level, in response to the signal output from said intermediate stage circuit section.

5. The level shift circuit as claimed in claim 4, further comprising:

a voltage generating circuit which generates the control voltage which is supplied to said intermediate stage circuit section.

6. The level shift circuit as claimed in claim 5, wherein said intermediate stage circuit section receives the control voltage from said voltage generating circuit during a transitional period of said intermediate stage circuit section.

* * * * *